United States Patent
Kim

(10) Patent No.: US 9,733,561 B2
(45) Date of Patent: Aug. 15, 2017

(54) METHOD AND APPARATUS FOR CLEANING ORGANIC MATERIALS

(71) Applicant: Samsung Display Co., Ltd., Yongin, Gyeonggi-do (KR)

(72) Inventor: Tae-Jong Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 580 days.

(21) Appl. No.: 14/097,381

(22) Filed: Dec. 5, 2013

(65) Prior Publication Data
US 2014/0326275 A1 Nov. 6, 2014

(30) Foreign Application Priority Data

May 2, 2013 (KR) ........................ 10-2013-0049607

(51) Int. Cl.
| | | |
|---|---|---|
| G03F 1/00 | (2012.01) | |
| G03F 1/82 | (2012.01) | |
| B08B 7/00 | (2006.01) | |
| B08B 7/04 | (2006.01) | |
| H01J 37/32 | (2006.01) | |

(52) U.S. Cl.
CPC .......... *G03F 1/0092* (2013.01); *B08B 7/0092* (2013.01); *B08B 7/04* (2013.01); *G03F 1/82* (2013.01); *H01J 37/32862* (2013.01)

(58) Field of Classification Search
None
See application file for complete search history.

(56) References Cited

U.S. PATENT DOCUMENTS

| | | | | |
|---|---|---|---|---|
| 7,993,464 B2 * | 8/2011 | LeClaire | ............... | B08B 7/0042 134/1 |
| 2002/0046953 A1 * | 4/2002 | Lee | ......... | B82Y 15/00 205/104 |
| 2006/0240669 A1 * | 10/2006 | Kaneko | ................. | C23C 14/042 438/680 |
| 2009/0203120 A1 * | 8/2009 | Shin | .......... | B01L 7/52 435/303.1 |
| 2010/0310759 A1 | 12/2010 | Lee et al. | | |
| 2013/0186334 A1 * | 7/2013 | Okimoto | ............... | C23C 16/042 118/718 |

FOREIGN PATENT DOCUMENTS

| | | |
|---|---|---|
| JP | 2001-158979 | 6/2001 |
| JP | 2007-179829 | 7/2007 |
| JP | 2007-234236 A | 9/2007 |
| KR | 1020090068006 A | 6/2009 |
| KR | 1020100066994 A | 6/2010 |
| KR | 10-2010-0132430 | 12/2010 |

OTHER PUBLICATIONS

English Machine Translation of JP 2007-234236 A.*

* cited by examiner

*Primary Examiner* — Nicole Blan
(74) *Attorney, Agent, or Firm* — Innovation Counsel LLP

(57) ABSTRACT

Provided are a method and apparatus for cleaning organic materials accumulated on a mask used in a process of depositing organic materials. The apparatus includes a plasma generating unit, a cleaning chamber connected to the plasma generating unit and accommodating the mask therein, a gas injection port disposed within the cleaning chamber configured to inject the plasma, and a cooling device disposed on a first surface of the mask opposite to an opposite surface of the mask facing the gas injection port.

7 Claims, 4 Drawing Sheets

METHOD AND APPARATUS FOR CLEANING ORGANIC MATERIALS

CROSS-REFERENCE TO RELATED PATENT APPLICATION

This application claims the benefit of Korean Patent Application No. 10-2013-0049607, filed on May 2, 2013, in the Korean Intellectual Property Office, the disclosure of which is incorporated herein in its entirety by reference.

BACKGROUND OF THE INVENTION

1. Field of the Invention

The present invention relates to a method and apparatus for cleaning organic materials, and more particularly, to a method and apparatus for cleaning organic materials accumulated on a mask used in a process of depositing organic materials.

2. Description of the Related Art

Because organic light-emitting display devices exhibit a larger field of view, higher contrast, and a faster response rate than other display devices, organic light-emitting display devices have been receiving much attention as next-generation displays.

In general, organic light-emitting display devices have a stacked structure that includes two electrodes, i.e., an anode and a cathode, and an emission layer interposed between the anode and the cathode. Such organic light-emitting display devices display colors according to the principle in which holes and electrons respectively injected from the anode and the cathode recombine at the emission layer to emit light. However, because it may be difficult to achieve high light emission efficiency using this structure, intermediate layers such as an electron injection layer (EIL), an electron transport layer (ETL), a hole transport layer (HTL), and a hole injection layer (HIL) may be additionally interposed between the emission layer and each of the electrodes.

Manufacturing organic light-emitting display devices often includes forming an organic thin film, such as an emission layer and an intermediate layer, in a fine pattern by using a deposition method. The deposition method includes placing a mask having the same pattern as a thin film to be formed in close contact with a surface of a substrate on which an organic thin film is to be formed, and depositing a thin film material on the substrate through the mask to form the thin film having the desired pattern.

Within a deposition chamber used to deposit the finely patterned organic thin film, devices that include the mask are subjected to preventive maintenance (PM) on a regular cycle when the deposition process is repeatedly performed. In a process of manufacturing organic light-emitting display devices using a fine metal mask (FMM), the FMM may be separated for cleaning according to a predetermined PM cycle (e. g., after every 80 depositions on the substrate).

Information disclosed in this Background section was already known to the inventors before achieving the example embodiments or is technical information acquired in the process of achieving the example embodiments. Therefore, it may contain information that does not form the prior art that is already known to a person of ordinary skill in the art.

SUMMARY

A method and apparatus for cleaning organic materials accumulated on a mask used in an organic material deposition process is provided.

According to an aspect, there is provided an apparatus for cleaning an organic material accumulated on a mask used to deposit an organic material pattern on a substrate, the apparatus including: a plasma generating unit for generating plasma; a cleaning chamber connected to the plasma generating unit and accommodating the mask therein; a gas injection port disposed within the cleaning chamber configured to inject the plasma generated by the plasma generating unit toward the mask; and a cooling device disposed on a first surface of the mask opposite to an opposite surface of the mask facing the gas injection port.

The cooling device may be in close contact with and coupled to the first surface of the mask.

The cooling device may contact the mask.

The cooling device may include at least one of a chiller, a thermoelectric module, a heat pipe, and a heat sink.

The apparatus may further include a magnetic member which is disposed on a surface of the cooling device opposite to the surface of the cooling device contacting the mask, and the magnetic member applies a predetermined magnetic force to the mask.

The magnetic member may produce the magnetic force in a direction such that the mask is pulled toward the magnetic member.

The gas injection port may disperse a flow of the plasma or change a direction of the flow of the plasma.

The gas injection port may inject the plasma from a lower part of the cleaning chamber toward the mask disposed at an upper part of the cleaning chamber.

According to another aspect, there is provided a method of cleaning an organic material accumulated on a mask used to deposit an organic material pattern on a substrate, the method including: coupling a cooling device to a first surface of the mask; cooling the mask by using the cooling device; within a cleaning chamber, providing plasma directed toward the mask coupled to the cooling device.

In the coupling of the cooling device, the cooling device may be in close contact with and coupled to the first surface of the mask that is opposite to a second surface of the mask facing the gas injection port.

In the cooling of the mask, the cooling device may contact the mask so as to directly cool the mask.

The cooling device may include at least one of a chiller, a thermoelectric module, a heat pipe, and a heat sink.

The coupling of the cooling device to the first surface of the mask may include disposing a magnetic member for applying a predetermined magnetic force to the mask on a surface of the cooling device opposite to a surface of the cooling device contacting the mask.

The magnetic member may produce the magnetic force in a direction such that the mask is pulled toward the magnetic member.

Providing plasma directed toward the mask coupled to the cooling device may include spraying plasma from a gas injection port, in which gas injection port may disperse a flow of the plasma or change a direction of the flow of the plasma.

Providing plasma directed toward the mask coupled to the cooling device may include spraying plasma from a gas injection port, in which gas injection port may inject the plasma from a lower part of the cleaning chamber toward the mask disposed at an upper part of the cleaning chamber.

The method and apparatus for cleaning organic materials may significantly reduce peeling of deposited organic materials from the mask during ashing. Furthermore, the method and apparatus may minimize deformation of a thin metal plate, such as the mask, due to plasma heat while preventing burning thereof. While a general plasma dry cleaner requires a separate flip device for inverting a mask in order to remove materials deposited on the mask, the apparatus according to the present disclosure may clean organic materials off the mask without a flip device, thereby reducing equipment costs and the size of the equipment required.

BRIEF DESCRIPTION OF THE DRAWINGS

The above and other features and advantages of the present will become more apparent by describing in detail example embodiments thereof with reference to the attached drawings in which.

DETAILED DESCRIPTION

Figure 1:
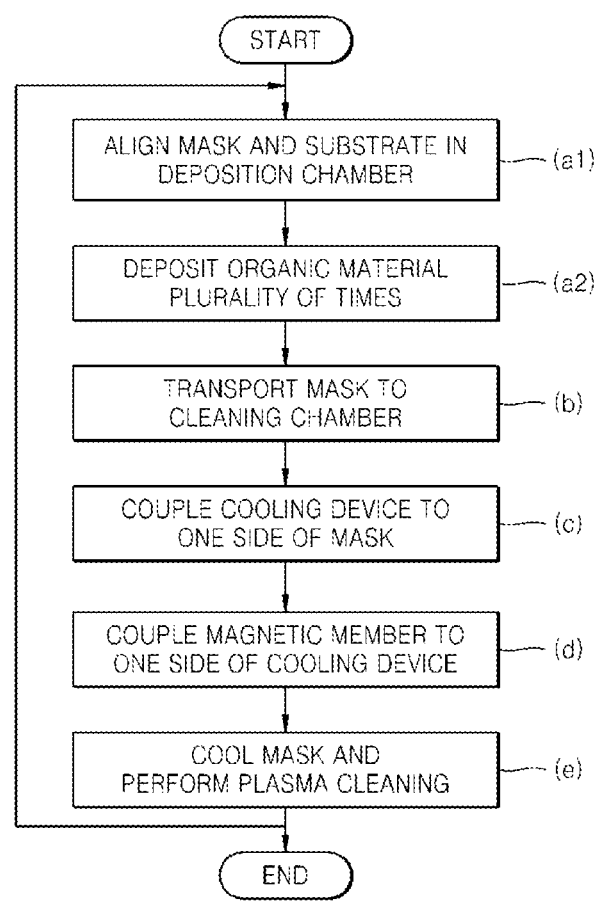
FIG. 1 is a flowchart of a method of cleaning organic materials accumulated on a mask used to deposit an organic material pattern on a substrate.

Reference will now be made in more detail to embodiments of the present disclosure, examples of which are illustrated in the accompanying drawings, wherein like reference numerals refer to like elements throughout. It should be understood that various example embodiments of the present disclosure are different from one another but need not be mutually exclusive. For example, particular shapes, structures, and features described herein with respect to an example embodiment may be used to implement another embodiment without departing from the spirit and scope of the present disclosure. It is further to be understood that locations or arrangements of individual components within each of the disclosed example embodiments may be changed without departing from the spirit and scope of the present disclosure. Therefore, a detailed description which will be described later should be considered in a descriptive sense only and not for purposes of limitation, and is intended to include all the changes or modifications within the scope of the disclosure, including the appended claims and their equivalents.

Hereinafter, example embodiments will be described in detail with reference to the accompanying drawings. Expressions such as "at least one of," when preceding a list of elements, modify the entire list of elements and do not modify the individual elements of the list.

FIG. 1 is a flowchart of a method of cleaning an organic material accumulated on a surface of a mask used to deposit an organic material pattern on a substrate.

Referring to FIG. 1, prior to cleaning of the organic material accumulated on the surface of the mask used to deposit an organic material pattern on the substrate, the mask including a plurality of slots is aligned with the substrate in a deposition chamber (operation a1), and a deposition of the organic material on the substrate is repeated a plurality of times (operation a2).

The substrate may be, for example, a substrate for an organic light emitting diode (OLED) panel. The substrate for an OLED panel includes organic thin film micro patterns for an emission layer and intermediate layers, such as an electron injection layer (EIL), an electron transport layer (ETL), a hole transport layer (HTL), and a hole injection layer (HIL), formed between an anode and a cathode. In order to form the organic thin film micro patterns by deposition, masks having patterns corresponding to the organic thin film micro patterns are prepared. The mask and the substrate for an OLED panel are aligned in a deposition chamber that is maintained in a high vacuum state such that a pattern of the mask coincides with a pattern to be formed on the substrate. The method according to the present example embodiment may be applied to substrates for OLED panels as described above, or any other substrate on which organic thin film patterns are formed.

The organic material that has been vaporized in a deposition source passes through the mask and is deposited on the substrate to thereby form a predetermined organic material pattern that corresponds to the pattern of the mask. When the deposition process is performed, a single mask may be used to deposit an organic material pattern on multiple substrates.

In cases in which the deposition process is repeatedly performed, devices within the deposition chamber that include the mask are subjected to preventive maintenance (PM) at a predetermined cycle. Because the deposition process ceases while the PM is performed, and it takes a considerable amount of time to recover the deposition conditions, including a vacuum level required for the deposition process after completing the PM. Therefore, a short PM cycle may be a main cause of decreased productivity. Conventionally, the mask is cleaned while the PM is performed. In this case, wet cleaning using a chemical solvent, such as those used to clean masks for a general semiconductor process, has a limitation in terms of its use in the deposition chamber for OLED display device, because the layers in an OLED display device are vulnerable to oxygen and moisture. Thus, cleaning the mask using wet cleaning requires use of a separate cleaning system outside of the deposition chamber. To solve this problem, an apparatus for cleaning an organic material according to an example embodiment also performs the following operations b through e after performing operations a1 and a2. The mask used for the plurality of depositions is transported to a cleaning chamber that is adjacent to the deposition chamber and maintained in a high vacuum state for cleaning the mask within the cleaning chamber (operation b). A cooling device is coupled to one surface of the mask, and in particular, to a surface of the mask opposite to that facing a gas injection port (operation c), and a magnetic member is attached to one surface of the cooling device (operation d). Thereafter, plasma cleaning is performed by directly cooling the mask by using the cooling device (operation e).

A method and apparatus for cleaning an organic material accumulated in a mask which is used to deposit an organic material and form an organic material pattern according to example embodiments will now be described in more detail with reference to FIGS. 2 through 4.

Figure 2:
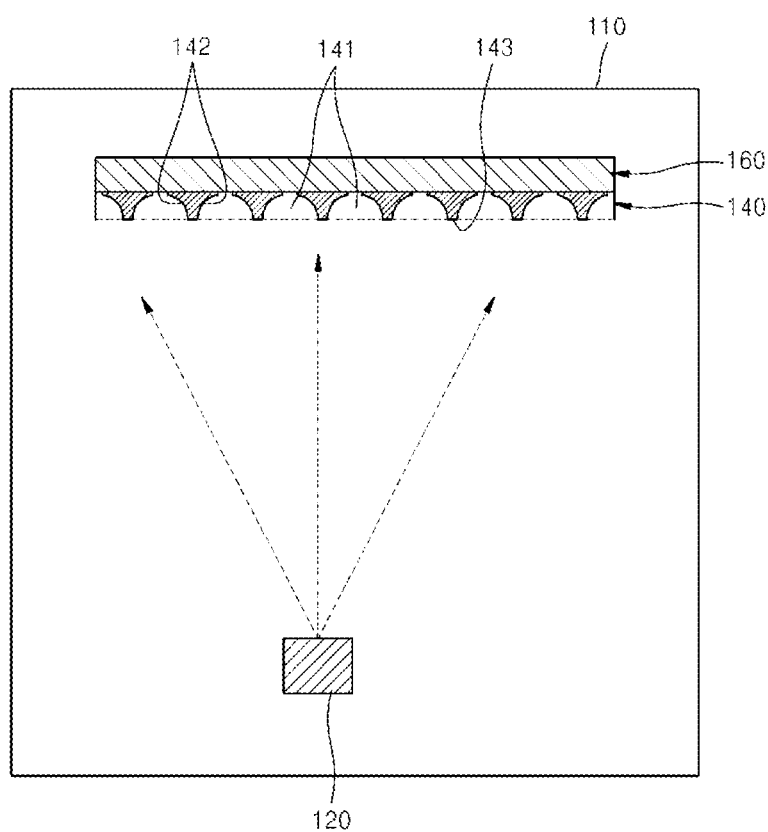
FIG. 2 is a schematic side view illustrating deposition of an organic material on a substrate for an organic light-emitting diode (OLED) panel using a mask in a deposition chamber.

FIG. 2 is a schematic side view illustrating deposition of an organic material on a substrate 160 for an OLED panel using a fine metal mask (FMM) 140 in a deposition chamber 110.

The FMM 140 is of the same size (i.e., has a same area in a plan view, not shown) as the substrate 160 in order to have the same pattern as an organic thin film pattern to be formed on the substrate 160. The FMM 140 is in close contact with the substrate 160 and aligned with the substrate 160.

The FMM 160 may have, for example, a striped shape. A surface of the FMM 140 facing the substrate 160 includes a plurality of first slots 141 that extend substantially parallel to one another along one direction. On a surface of the FMM 140 opposite to that facing the substrate 160, boundaries 142 between the first slots 141 are formed obliquely with respect to bases 143 during etching of the pattern of the FMM 140. Although the FMM 140 has a striped shape, the present disclosure is not limited thereto, and masks having various shapes such as a dot shape may be cleaned by the method and apparatus for cleaning an organic material according to the example embodiments.

A deposition source 120 is, for example, a crucible containing the organic material to be deposited on the substrate 160. The deposition chamber 110 may be kept in a high vacuum state in order to allow the organic material to move in a straight line. A vacuum level within the deposition chamber 110 may be maintained at less than or equal to about 10E-7 Torr.

The organic material is vaporized from the deposition source 110, passes through the first slots 141 formed in the FMM 140, and is deposited on the substrate 160. The vaporized organic material may be deposited at a predetermined angle with respect to the surface of the FMM 140. In this case, the organic material that has not passed through the first slots 141 accumulates on the bases 143 of the FMM 140 and the boundaries 142 of the first slots 141 thereof.

Figure 3:
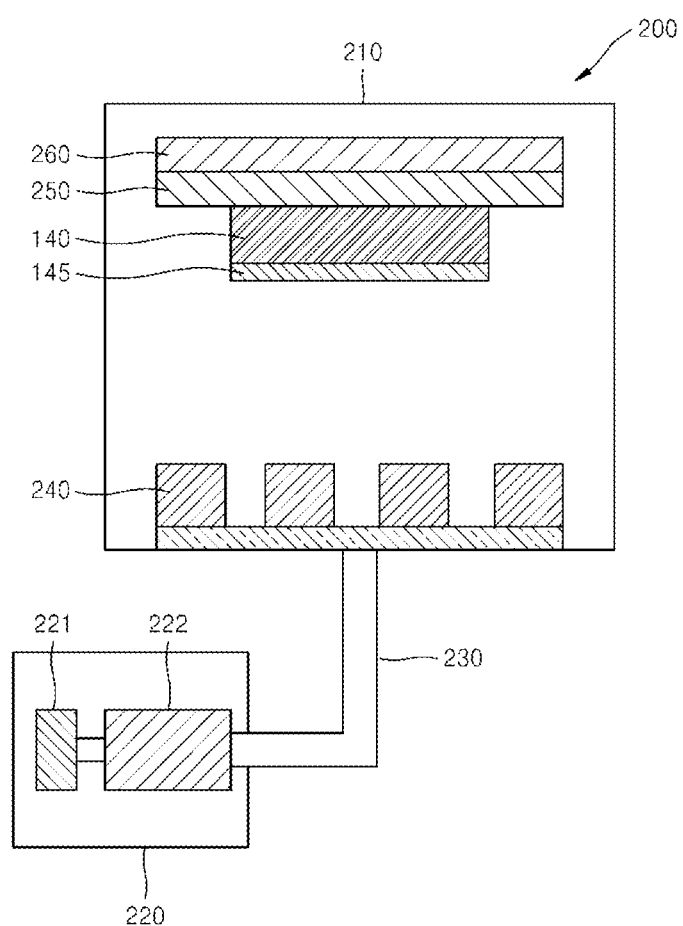
FIG. 3 illustrates an apparatus for cleaning an organic material according to an example embodiment.

FIG. 3 illustrates an apparatus 200 for cleaning an organic material according to an example embodiment.

Referring to FIG. 3, the apparatus 200 for cleaning an organic material according to the present example embodiment includes a cleaning chamber 210, a plasma generating unit 220, a gas pipe 230, a gas injection port 240, a cooling device 250, and a magnetic member 260. In this case, a mask 140 having an organic material 145 accumulated thereon may also be disposed within the cleaning chamber 210.

The apparatus 200 uses the cooling device 250 and the magnetic member 260, which are coupled to one side of the mask 140 to be cleaned, to directly cool the mask 140, thereby preventing deformation of the mask 140 due to plasma heat. The apparatus 200 is configured to prevent the organic material that is to be removed from being hardened due to plasma heat, or from escaping from the mask 140 and causing a secondary contamination due to a difference between thermal expansion coefficients of the organic material and the mask. This configuration may allow stable plasma cleaning.

More specifically, a general plasma dry cleaning process uses indirect cooling, such as helium (He) cooling, to cool the mask after it has been loaded into the cleaning chamber. In a process which uses direct cooling instead of indirect cooling, the mask has to be flipped, which requires the use of a separate device, and may increase the equipment costs. However, the indirect cooling has a limitation in terms of control of cooling due to reduced thermal conductivity. Thus, the indirect cooling has drawbacks in that the organic material to be removed may burn due to plasma heat, or an organic layer may be peeled off due to a difference between thermal expansion coefficients of the organic layer and the mask made of metal to thereby cause secondary contamination within the cleaning chamber.

To overcome these problems, the apparatus 200 according to the present example embodiment employs the cooling device 250 and the magnetic member 260, which are coupled to the side of the mask 140 to be cleaned, to suppress a temperature rise on a surface of the mask 140. During plasma dry cleaning, this configuration may prevent the organic material from falling off the mask 140 and also minimizes deformation of the mask 140 due to heat. Furthermore, the apparatus 200 may perform plasma dry cleaning without using a separate flip device for direct cooling, thereby achieving low equipment costs.

More specifically, the plasma generating unit 220 includes a cleaning gas supply source 221 and a plasma generator 222. Cleaning gas supplied by the cleaning gas supply source 221 is turned into plasma by the plasma generator 222 and supplied to the cleaning chamber 210 through the gas pipe 230. The cleaning gas may be, for example, a mixture of Carbon Tetrafluoride ($CF_4$) and oxygen ($O_2$). Alternatively, a carrier gas such as, for example, nitrogen ($N_2$) may be added to the mixture. In this case, the plasma generated by the plasma generating unit 220 may be a plasma-excited gas and may contain ions having charges and radicals having no charges.

The gas pipe 230 delivers the plasma generated by the plasma generating unit 220 to the gas injection port 240 in the cleaning chamber 210. The gas injection port 240 may have the shape of a shower head, for example, including several small nozzles, and is disposed below the mask 140 within the cleaning chamber 210 so as to inject the plasma from a lower part of the cleaning chamber 210 towards the mask 140. The gas injection port 260 disperses a flow of the plasma or changes a direction of the flow of the plasma so that the plasma is directed toward mask 140.

The cooling device 250 and the magnetic member 260 may be disposed on one surface of the mask opposite to the surface where the organic material has been accumulated. A surface of the mask 140 on which the organic material 145 has accumulated faces the gas injection port 240. The coding device 250 may be disposed on the entire surface of the mask 140 while being in dose contact therewith.

Different types of coders such as, for example, a chiller may be used as the cooling device 250. The chiller refers to a water coder used on a refrigerator having a compressor, other than a centrifugal compressor, on a vapor-compression refrigeration cycle. The chiller typically includes a compressor, a condenser, an evaporator, and a water coder combined in a single unit.

The coding device 250 may be, for example, a thermoelectric module such as a Peltier device and be connected to an external power supply (not shown) to cod the mask 140. The thermoelectric module uses a Peltier effect whereby when a current is applied across junctions of two different metals, heat is emitted from one junction and heat is absorbed by the other junction. Generally, the thermoelectric module is formed of an n-type semiconductor and a p-type semiconductor, both of which are used as a coding junction and joined by a copper (Cu) plate.

Alternatively, the cooling device 250 may be, for example, a heat pipe through which a predetermined liquid coolant circulates, or a heat sink including a plurality of heat dissipating fins for dissipating heat to the outside air. Other various components for coding the mask 140 may be used as the cooling device 250, and in general, any coding device capable of coding the mask 140 to a temperature low enough to prevent thermal expansion of the mask and that can provide coding to the entire mask may be used as coding device 250. Such a temperature is in the range of about 15° C. to about 25° C., because a cooling line is accommodated in the coding device 250.

The magnetic member 260 may also be disposed on one surface of the coding device 250, and in particular, on a surface of the coding device 250 opposite to that adhering to the mask 140, so as to improve the cooling performance of the coding device 250. The magnetic member 260 produces a magnetic force in a direction such that the mask 140 is pulled toward the magnetic member 260 itself. Thus, the magnetic member 260 may further strengthen the coupling between the coding device 250 and the mask 140, thereby achieving more efficient heat exchange (mask coding) therebetween. Magnetic member 260 may have, for example, a square shape.

According to a direct coding method used in the present disclosure, when an organic material is accumulated on the mask 140 of a thin metal, thermal expansion of the mask 140 due to plasma may be minimized to suppress escaping of the organic material, and a direct cooling system may be constructed without the use of a separate mask flip device. More specifically, because a mask sheet (not shown) in the mask 140 is quite thin, the mask sheet may undergo rapid thermal deformation at a predetermined temperature when the temperature of the mask sheet rises due to plasma heat. Furthermore, because the thin mask sheet is thermally deformed to a greater extent than the organic material, the organic material may peel off from the mask 140 before plasma ashing occurs. Thus, lowering the heat transferred to the mask 140 is absolutely necessary for preventing peeling of the organic material. To achieve this, the apparatus 200 for cleaning an organic material according to the present embodiment includes the cooling device 250 and the magnetic member 260 disposed on one side of the mask 140, and performs plasma cleaning by cooling the mask using a direct cooling method.

Figure 4:
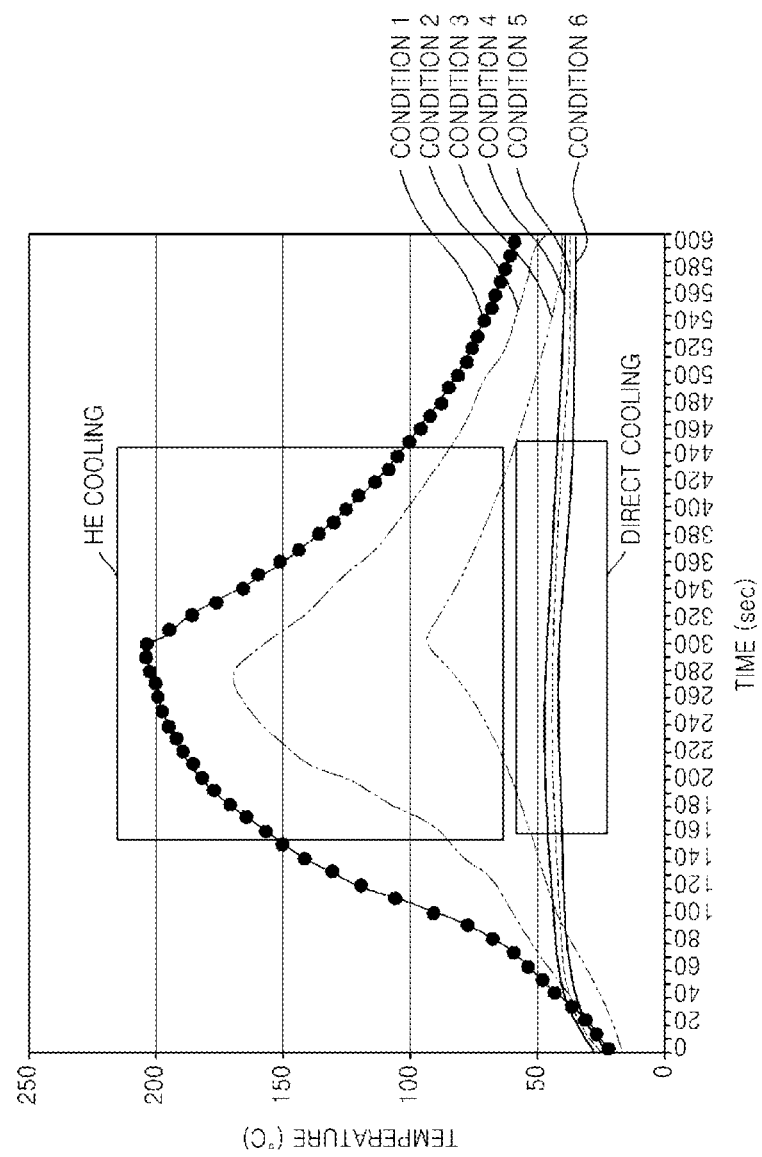
FIG. 4 illustrates a change in temperature of a mask over time due to plasma heat.

FIG. 4 illustrates a change in temperature of a mask over time due to plasma heat. The ordinate and abscissa in FIG. 4 denote the temperature of the mask and the time, respectively.

Referring to FIG. 4, compared to when a mask is cleaned by performing indirect cooling such as He cooling, an increase in temperature of the mask can be significantly reduced when an apparatus for cleaning an organic material according to an embodiment of the present disclosure uses direct cooling to cool a mask. The use of direct cooling may effectively reduce the increase in temperature of the mask due to plasma heat in this way, thereby significantly suppressing peeling of the organic material from the mask.

In FIG. 4, Condition 1, Condition 2, and Condition 3 for a process using indirect cooling respectively represent cases where an ashing rate (Å/min) was low (1 um), medium (1.6 um), and high (2.0 um). Likewise, Condition 4, Condition 5, and Condition 6 for a process using direct cooling in accordance with the embodiments respectively represent cases where an ashing rate was low (1 um), medium (1.6 um), and high (2.0 um). As is apparent from temperature profiles for Conditions 1 through 6 of FIG. 4, the process using indirect cooling exhibited large temperature differences among Conditions 1 through 3 while the direct cooling exhibited only a slight difference among Conditions 4 through 6. Furthermore, when the process using indirect cooling was performed, the organic material was peeled off from the mask under Conditions 1 through 3. On the other hand, when the process using direct cooling was performed, peeling of the organic material did not occur under Conditions 4 and 5 in which the ashing rate was low. Only under Condition 6, in which the ashing rate was high, did the organic material peel off from the mask, but to a smaller extent than under Conditions 1 through 3 in which the process using indirect cooling was used.

As described above, the method and apparatus for cleaning an organic material according to embodiments of the present disclosure may significantly reduce peeling of deposited organic materials from a mask during ashing. Furthermore, the method and apparatus may minimize deformation of a thin metal plate, such as a mask, due to plasma heat while preventing burning thereof. While a general plasma dry cleaner requires a separate flip device for inverting a mask in order to remove materials deposited on the mask, the apparatus according to the present disclosure may clean organic materials off the mask without the use of a flip device, thereby reducing equipment costs and size.

While the present disclosure has been particularly shown and described with reference to example embodiments thereof, it will be understood by those of ordinary skill in the art that various changes in form and details may be made therein without departing from the spirit and scope of the present disclosure, including the following claims. Although not described herein, all differences within the scope of the appended claims and their equivalents will also be construed as being included in the present invention.

What is claimed is:

1. A method of cleaning an organic material accumulated on a mask used to deposit an organic material pattern on a substrate, the method comprising:
   coupling a cooling device to a first surface of the mask;
   cooling the mask by using the cooling device; and
   within a cleaning chamber, providing plasma directed toward the mask coupled to the cooling device to clean the organic material accumulated on the mask,
   wherein in the cooling of the mask, the cooling device contacts an entirety of the first surface of the mask so as to directly cool the mask during the cleaning of the organic material.

2. The method of claim 1, wherein in the coupling of the cooling device, the cooling device is in close contact with and coupled to the first surface of the mask that is opposite to a second surface of the mask facing a gas injection port.

3. The method of claim 2, wherein the cooling device comprises at least one of a chiller, a thermoelectric module, a heat pipe, and a heat sink.

4. The method of claim 3, wherein coupling the cooling device to the first surface of the mask includes disposing a magnetic member for applying a predetermined magnetic force to the mask on a surface of the cooling device opposite to a surface of the cooling device contacting the mask.

5. The method of claim 4, wherein the magnetic member produces the predetermined magnetic force in a direction such that the mask is pulled toward the magnetic member.

6. The method of claim 4, wherein providing plasma directed toward the mask coupled to the cooling device includes spraying plasma from a gas injection port, wherein the gas injection port disperses a flow of the plasma or changes a direction of the flow of the plasma.

7. The method of claim 1, wherein providing plasma directed toward the mask coupled to the cooling device includes spraying plasma from a gas injection port, wherein the gas injection port injects the plasma from a lower part of the cleaning chamber toward the mask disposed at an upper part of the cleaning chamber.

* * * * *